(12) United States Patent
Gu et al.

(10) Patent No.: US 12,087,822 B2
(45) Date of Patent: Sep. 10, 2024

(54) TRENCH SiC MOSFET INTEGRATED WITH HIGH-SPEED FLYBACK DIODE AND PREPARATION METHOD THEREOF

(71) Applicant: NOVUS SEMICONDUCTORS CO., LTD., Chengdu (CN)

(72) Inventors: Hang Gu, Leshan (CN); Wei Gao, Beijing (CN); Maozhou Dai, Chengdu (CN)

(73) Assignee: NOVUS SEMICONDUCTORS CO., LTD., Chengdu (CN)

( * ) Notice: Subject to any disclaimer, the term of this patent is extended or adjusted under 35 U.S.C. 154(b) by 0 days.

(21) Appl. No.: 18/580,161

(22) PCT Filed: Apr. 13, 2023

(86) PCT No.: PCT/CN2023/087960
§ 371 (c)(1),
(2) Date: Jan. 18, 2024

(87) PCT Pub. No.: WO2024/001422
PCT Pub. Date: Jan. 4, 2024

(65) Prior Publication Data
US 2024/0266404 A1   Aug. 8, 2024

(30) Foreign Application Priority Data

Jun. 30, 2022  (CN) .......................... 202210755222.9

(51) Int. Cl.
*H01L 29/16* (2006.01)
*H01L 29/66* (2006.01)
*H01L 29/78* (2006.01)

(52) U.S. Cl.
CPC .... *H01L 29/1608* (2013.01); *H01L 29/66068* (2013.01); *H01L 29/66734* (2013.01); *H01L 29/7804* (2013.01); *H01L 29/7813* (2013.01)

(58) Field of Classification Search
CPC .......... H01L 29/1608; H01L 29/66068; H01L 29/66734; H01L 29/7804; H01L 29/7813
(Continued)

(56) References Cited

U.S. PATENT DOCUMENTS

| | | | |
|---|---|---|---|
| 6,046,470 A | | 4/2000 | Williams et al. |
| 2020/0235239 A1 | * | 7/2020 | Noborio ............ H01L 29/41725 |

FOREIGN PATENT DOCUMENTS

| | | | |
|---|---|---|---|
| CN | 110998861 A | | 4/2020 |
| CN | 114122123 A | * | 3/2022 |

(Continued)

OTHER PUBLICATIONS

WO-2015049838-A1 (Year: 2015).*
CN-114122123-A (Year: 2022).*

*Primary Examiner* — Igwe U Anya
(74) *Attorney, Agent, or Firm* — Bayramoglu Law Offices LLC

(57) ABSTRACT

A trench SiC MOSFET integrated with a high-speed flyback diode and a preparation method thereof are provided. The MOSFET is a trench structure, a trench-type gate-controlled diode is added in the vicinity of the MOSFET to solve the problem of electric field concentration at the bottom and corners of a trench, and P-type buried layers are added to the bottom of the trench to decrease the electric field intensity. Moreover, the gate-controlled diode and a body diode of the device are connected in parallel, so the on-voltage drop of the body diode is greatly decreased, thus reducing the loss in the reverse recovery mode. In addition, the gate-controlled diode is a unipolar device without the charge-storage effect, so the reverse recovery current of the body diode can be completely eliminated, thus reducing the dynamic loss.

8 Claims, 7 Drawing Sheets

(58) Field of Classification Search
USPC .......................................................... 257/77
See application file for complete search history.

(56) References Cited

FOREIGN PATENT DOCUMENTS

| | | | |
|---|---|---|---|
| CN | 114551586 A | 5/2022 | |
| CN | 114823911 A | 7/2022 | |
| WO | WO-2015049838 A1 * | 4/2015 | ......... H01L 29/0623 |

* cited by examiner

TRENCH SiC MOSFET INTEGRATED WITH HIGH-SPEED FLYBACK DIODE AND PREPARATION METHOD THEREOF

CROSS REFERENCE TO THE RELATED APPLICATIONS

This application is the national phase entry of International Application No. PCT/CN2023/087960, filed on Apr. 13, 2023, which is based upon and claims priority to Chinese Patent Application No. 202210755222.9, filed on Jun. 30, 2022, the entire contents of which are incorporated herein by reference.

TECHNICAL FIELD

The invention belongs to the technical field of power semiconductor devices, and particularly relates to a trench SiC MOSFET integrated with a high-speed flyback diode and a preparation method thereof.

BACKGROUND OF THE INVENTION

The wide bandgap semiconductor material SiC is an ideal material for preparing high-voltage power electronic devices, which compared with the material Si, has the advantages of high breakdown electric field intensity ($4 \times 10^6$ V/cm), high saturated drift velocity ($2 \times 10^7$ cm/s) of carriers, high heat conductivity, good heat stability, and the like, thus being particularly suitable for high-power, high-voltage, high-temperature and radiation-resistant electronic devices.

Compared with bipolar devices, SiC VDMOSs, as common devices of SiC power devices, are free of the charge-storage effect, thus having a better frequency property and a lower switching loss. Moreover, the wide bandgap of the material SiC allows the operating temperature of the SiC VDMOSs to be as high as 300° C.

However, planar SiC VDMOSs have the following two problems: first, the large density of the JFET region leads to a large miller capacitance, increasing the dynamic loss of devices; second, a parasitic SiC body diode has an excessively high on-voltage drop, and as a bipolar device, has a large reverse recovery current, and the on-voltage drop of the body diode will increase constantly with time due to a bipolar degradation caused by BPD defects of SiC, so the body diode of the SiC VDMOSs cannot be directly used as a flyback diode.

To solve these two problems, the invention provides a trench SiC MOSFET integrated with a high-speed flyback diode. The MOSFET provided by the invention is a trench structure, gate oxide layers at the bottom of polysilicon of the trench MOSFET are thick, and P-type doped buried layers are added to the bottom of a trench, so compared with planar VDMOSs, the miller capacitance of the trench SiC MOSFET can be greatly decreased, and the switching loss of the trench SiC MOSFET is reduced. A trench-type gate-controlled diode is added in the vicinity of the MOSFET to solve the problem of electric field concentration at the bottom and corners of the trench, and P-type buried layers are added to the bottom of the trench to decrease the electric field intensity. Moreover, the gate-controlled diode and the body diode of the device are connected in parallel, so the on-voltage drop of the body diode is greatly decreased, thus reducing the loss in the reverse recovery mode. In addition, the gate-controlled diode is a unipolar device without the charge-storage effect, so the reverse recovery current of the body diode can be completely eliminated, thus reducing the dynamic loss.

BRIEF SUMMARY OF THE INVENTION

Technical Solutions

The technical issue to be settled by the invention is to solve the problems in the prior art by providing a trench SiC MOSFET integrated with a high-speed flyback diode and a preparation method thereof to satisfy the application requirement of high-frequency switching of SiC power semiconductors.

To settle the above technical issue, the invention adopts the following the technical solution:

A trench SiC MOSFET integrated with a high-speed flyback diode comprises a back ohmic contact alloy 1, an N-type doped SiC substrate 2, an N-type doped SiC epitaxial layer 3, a first P-type doped buried layer 41, a second P-type doped buried layer 42, a third P-type doped buried layer 43, a first gate oxide layer 51, a second gate oxide layer 52, a first polysilicon layer 61, a second polysilicon layer 62, a first P-type doped well region 71, a second P-type doped well region 72, a third P-type doped well region 73, a first N-type doped source region 81, a second N-type doped source region 82, a P-type doped source region 9, an inter-layer dielectric 10, and a front ohmic contact alloy 11;

In a plane defined by an x-axis and a y-axis, the N-type doped SiC substrate 2 is located over the back ohmic contact alloy 1, the N-type doped SiC epitaxial layer 3 is located over the N-type doped SiC substrate 2, the second P-type doped buried layer 42 is located over a right portion of the N-type doped SiC epitaxial layer 3, the third P-type doped buried layer 43 is located over a left portion of the N-type doped SiC epitaxial layer 3, the first gate oxide layer 51 is located over the second P-type doped buried layer 42, the second gate oxide layer 52 is located over the third P-type doped buried layer 43, the first polysilicon layer 61 is located over a right portion of the first gate oxide layer 51, the second polysilicon layer 62 is located over a left portion of the second gate oxide layer 52, the first N-type doped source region 81 is located over a left portion of the first gate oxide layer 51, the P-type doped source region 9 is located on a left side of the first N-type doped source region 81, the second N-type doped source region 82 is located on a left side of the P-type doped source region 9 and is connected to a right side of the second gate oxide layer 52, the first P-type doped well region 71 is located under the first N-type doped source region 81 and on a left side of the first gate oxide layer 51, the second P-type doped well region 72 is located under the first N-type doped source region 81, the P-type doped source region 9 and the second N-type doped source region 82 and on a left side of the first N-type doped source region 71, the third P-type doped well region 73 is located under the second N-type doped source region 82 and on a left side of the second P-type doped well region 72, the inter-layer dielectric 10 is located over the first N-type doped source region 81, the first gate oxide layer 51 and the first polysilicon layer 61, and the front ohmic contact alloy 11 is located over the inter-layer dielectric 10, the first N-type doped source region 81, the P-type doped source region 9, the second N-type doped source region 82, the second gate oxide layer 52, and the second polysilicon layer 62;

In a plane defined by the y-axis and a z-axis, the N-type doped SiC substrate 2 is located over the back ohmic contact alloy 1, the N-type doped SiC epitaxial layer 3 is located over the N-type doped SiC substrate 2, the first P-type doped buried layer 41 is located at an upper right position in the N-type doped SiC epitaxial layer 3, the second P-type doped buried layer 42 is located at an upper left position in the N-type doped SiC epitaxial layer 3, the first gate oxide layer 51 is located over the first P-type doped buried layer 41, the N-type doped SiC epitaxial layer 3 and the second P-type doped buried layer 42, the first polysilicon layer 61 is located over the first gate oxide layer 51, the inter-layer dielectric 10 is located over the first polysilicon layer 61, and the front ohmic contact alloy 11 is located over the inter-layer dielectric 10.

Preferably, the N-type doped SiC epitaxial layer 3 has a doping concentration of $1E15$ cm$^{-3}$-$1E17$ cm$^{-3}$.

Preferably, the first P-type doped well region 71 is formed by transverse scattering during Al ion implantation, and has a concentration decreasing gradually in a negative direction of the x-axis, and the concentration of the first P-type doped well region 71 close to the first gate oxide layer 51 is $1E14$ cm$^{-3}$-$1E16$ cm$^{-3}$.

Preferably, the third P-type doped well region 73 is formed by traverse scattering during Al ion implantation, and has a concentration decreasing gradually in a positive direction of the x-axis, and the concentration of the third P-type doped well region 73 close to the second gate oxide layer 52 is $0$-$1E15$ cm$^{-3}$.

A preparation method of the trench SiC MOSFET integrated with a high-speed flyback diode comprises:

Step 1: depositing an oxide layer on an N-type SiC epitaxial wafer, forming a P-well ion implantation mask 101 for ion implantation by lithography, then performing Al ion implantation at a temperature of 300K-1000K to form the second P-type doped well region 72, synchronously forming P-doped scattering regions with a concentration changing gradually in a traverse direction, which are the first P-type doped well region 71 and the third P-type doped well region 73 respectively, on left and right sides of the second P-type doped well region 72 by transverse scattering during the Al ion implantation of SiC, removing the mask layer after the Al ion implantation is completed, and performing surface cleaning;

Step 2: depositing an oxide layer, forming an N-type source region ion implantation mask 102 for ion implantation by lithography, then performing P ion implantation at a temperature of 300K-1000K to form the first N-type doped source region 81 and the second N-type doped source region 82, removing the mask after the P ion implantation is completed, and performing surface cleaning;

Step 3: depositing an oxide layer, forming a P-type source region ion implantation mask 103 for ion implantation by lithography, then then performing Al ion implantation at a temperature of 300K-1000K to form the P-type doped source region 9, removing the mask after the Al ion implantation is completed, and performing surface cleaning;

Step 4: depositing an oxide layer, forming a trench etching barrier layer 104 by lithography, and then performing reactive ion etching on the N-type doped SiC epitaxial layer 3 to form a trench;

Step 5: performing Al ion implantation at a high temperature of 300K-1000K to form the second P-type doped buried layer 42 and the third P-type doped buried layer 43 at a bottom of the trench, and removing the trench etching barrier layer 104 after the Al ion implantation is completed;

Step 6: laying a carbon cap, performing annealing at a high temperature over 1600° C. to activate implanted impurities, forming the first gate oxide layer 51 and the second gate oxide layer 52 by thermal oxidation, then depositing polysilicon, and forming the first polysilicon layer 61 and the second polysilicon layer 62 by etching;

Step 7: depositing an oxide layer, and forming the inter-layer dielectric 10 by lithography; and Step 8: depositing an Ni alloy, forming a metal silicide by annealing, then depositing Al on a front side of the device to form a source metal, sputtering the Ni alloy on a back side of the device, and forming the back ohmic contact alloy 1 by annealing.

Beneficial Effects

Compared with the prior art, the invention has the following beneficial effects:

In the intention, by adopting the trench and the P-type buried layers, the miller capacitance of the device is greatly decreased, thus reducing the switching loss of the device. In addition, the addition of the P-type buried layers weakens electric field concentration at the bottom and corners of the trench, thus improving the long-term reliability of the device.

The trench SiC MOSFET provided by the invention is integrated with a gate-controlled diode, which is a trench structure, and the trench of the gate-controlled diode and the trench of the MOSFET are formed synchronously without an extra process step. The gate-controlled diode is an MOSFET diode-connected rectifier, compared to the body diode of traditional MOSFETs, has the advantages of low on-voltage drop and unipolar conduction (without reverse recovery current and bipolar degradation), and the rectifier can be used as a flyback diode of the MOSFET, so the dynamic loss is greatly reduced. Moreover, the addition of the gate-controlled diode also decreases the electric field intensity at the bottom and corners of the trench of the MOSFET, thus improving the long-term reliability of the device.

In the invention, the trench of the MOSFET and the trench of the gate-controlled diode are formed by means of the scattering effect during Al ion implantation, so the doping concentration of the trench region of the device can be decreased on the premise of guaranteeing sufficient electric charges in the P-type well regions. For the MOSFET, the doping concentration of the trench region can be controlled by controlling the relative positions of the trench and the P-type doped well regions, to accurately control the threshold voltage of the MOSFET. For the gate-controlled diode, the doping concentration of the trench region can be controlled by controlling the relative positions of the trench and the P-type doped well regions, so as to control the on-voltage drop of the gate-controlled diode.

For example, in a half-bridge or full-bridge application scenario where an MOSFET needs to be reversely connected in parallel with a SiC Schottky diode for reverse recovery, an extra flyback diode is not needed anymore by adopting the trench SiC MOSFET integrated with a high-speed flyback diode provided by the invention.

1, back ohmic contact alloy; 2, N-type doped SiC substrate; 3, N-type doped SiC epitaxial layer; 41, first P-type doped buried layer; 42, second P-type doped buried layer; 43, third P-type doped buried layer; 51, first gate oxide layer; 52, second gate oxide layer; 61, first polysilicon layer; 62, second polysilicon layer; 71, first P-type doped well region; 72, second P-type doped well region; 73, third P-type doped well region; 81, first N-type doped source region; 82, second N-type doped source region; 9, P-type doped source region; 10, inter-layer dielectric; 11, front ohmic contact alloy; 101, P-well ion implantation mask; 102, N-type source region ion implantation mask; 103, P-type source region ion implantation mask; 104, trench etching barrier layer.

DETAILED DESCRIPTION OF THE INVENTION

The principle and features of the invention will be described below in conjunction with accompanying drawings. The following examples are merely used for explaining the invention, and are not intended to limit the scope of the invention.

Embodiment 1

Figure 1:
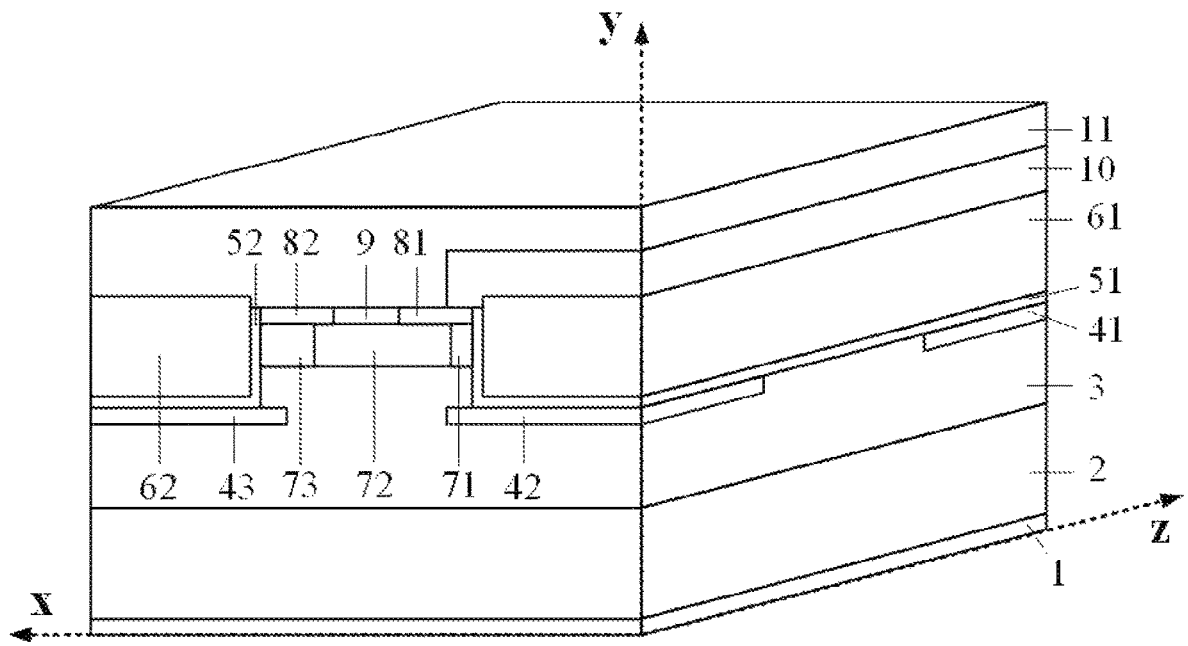
FIG. 1 is a structural view of a trench SiC MOSFET integrated with a high-speed flyback diode according to the invention.

As shown in FIG. 1, this embodiment provides a trench SiC MOSFET integrated with a high-speed flyback diode, comprising a back ohmic contact alloy 1, an N-type doped SiC substrate 2, an N-type doped SiC epitaxial layer 3, a first P-type doped buried layer 41, a second P-type doped buried layer 42, a third P-type doped buried layer 43, a first gate oxide layer 51, a second gate oxide layer 52, a first polysilicon layer 61, a second polysilicon layer 62, a first P-type doped well region 71, a second P-type doped well region 72, a third P-type doped well region 73, a first N-type doped source region 81, a second N-type doped source region 82, a P-type doped source region 9, an inter-layer dielectric 10, and a front ohmic contact alloy 11;

In a plane defined by an x-axis and a y-axis, the N-type doped SiC substrate 2 is located over the back ohmic contact alloy 1, the N-type doped SiC epitaxial layer 3 is located over the N-type doped SiC substrate 2, the second P-type doped buried layer 42 is located over a right portion of the N-type doped SiC epitaxial layer 3, the third P-type doped buried layer 43 is located over a left portion of the N-type doped SiC epitaxial layer 3, the first gate oxide layer 51 is located over the second P-type doped buried layer 42, the second gate oxide layer 52 is located over the third P-type doped buried layer 43, the first polysilicon layer 61 is located over a right portion of the first gate oxide layer 51, the second polysilicon layer 62 is located over a left portion of the second gate oxide layer 52, the first N-type doped source region 81 is located over a left portion of the first gate oxide layer 51, the P-type doped source region 9 is located on a left side of the first N-type doped source region 81, the second N-type doped source region 82 is located on a left side of the P-type doped source region 9 and is connected to a right side of the second gate oxide layer 52, the first P-type doped well region 71 is located under the first N-type doped source region 81 and on a left side of the first gate oxide layer 51, the second P-type doped well region 72 is located under the first N-type doped source region 81, the P-type doped source region 9 and the second N-type doped source region 82 and on a left side of the first N-type doped source region 71, the third P-type doped well region 73 is located under the second N-type doped source region 82 and on a left side of the second P-type doped well region 72, the inter-layer dielectric 10 is located over the first N-type doped source region 81, the first gate oxide layer 51 and the first polysilicon layer 61, and the front ohmic contact alloy 11 is located over the inter-layer dielectric 10, the first N-type doped source region 81, the P-type doped source region 9, the second N-type doped source region 82, the second gate oxide layer 52, and the second polysilicon layer 62;

In a plane defined by the y-axis and a z-axis, the N-type doped SiC substrate 2 is located over the back ohmic contact alloy 1, the N-type doped SiC epitaxial layer 3 is located over the N-type doped SiC substrate 2, the first P-type doped buried layer 41 is located at an upper right position in the N-type doped SiC epitaxial layer 3, the second P-type doped buried layer 42 is located at an upper left position in the N-type doped SiC epitaxial layer 3, the first gate oxide layer 51 is located over the first P-type doped buried layer 41, the N-type doped SiC epitaxial layer 3 and the second P-type doped buried layer 42, the first polysilicon layer 61 is located over the first gate oxide layer 51, the inter-layer dielectric 10 is located over the first polysilicon layer 61, and the front ohmic contact alloy 11 is located over the inter-layer dielectric 10.

The N-type doped SiC epitaxial layer 3 has a doping concentration of $1E15$ $cm^{-3}$-$1E17$ $cm^{-3}$;

The first P-type doped well region 71 is formed by transverse scattering during Al ion implantation, and has a concentration decreasing gradually in a negative direction of the x-axis, and the concentration of the first P-type doped well region 71 close to the first gate oxide layer 51 is $1E14$ $cm^{-3}$-$1E16$ $cm^{-3}$.

The third P-type doped well region 73 is formed by traverse scattering during Al ion implantation, and has a concentration decreasing gradually in a positive direction of the x-axis, and the concentration of the third P-type doped well region 73 close to the second gate oxide layer 52 is 0-1E15 cm$^{-3}$.

Figure 10:
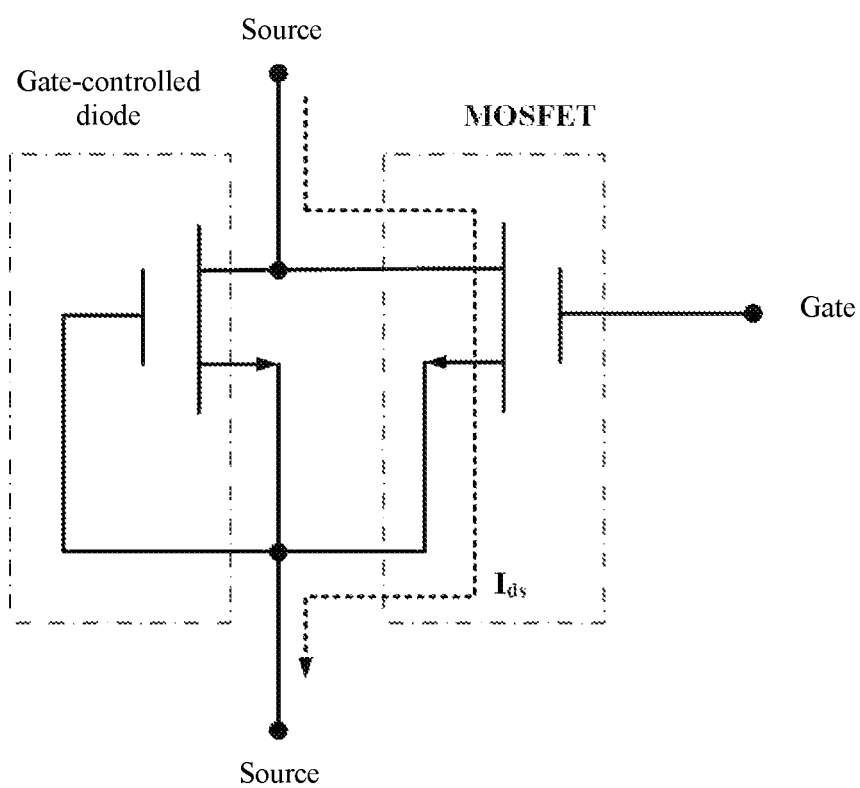
FIG. 10 is an equivalent circuit diagram of the trench SiC MOSFET integrated with a high-speed flyback diode when the trench SiC MOSFET is forward turned on according to Embodiment 1 of the invention.
Figure 11:
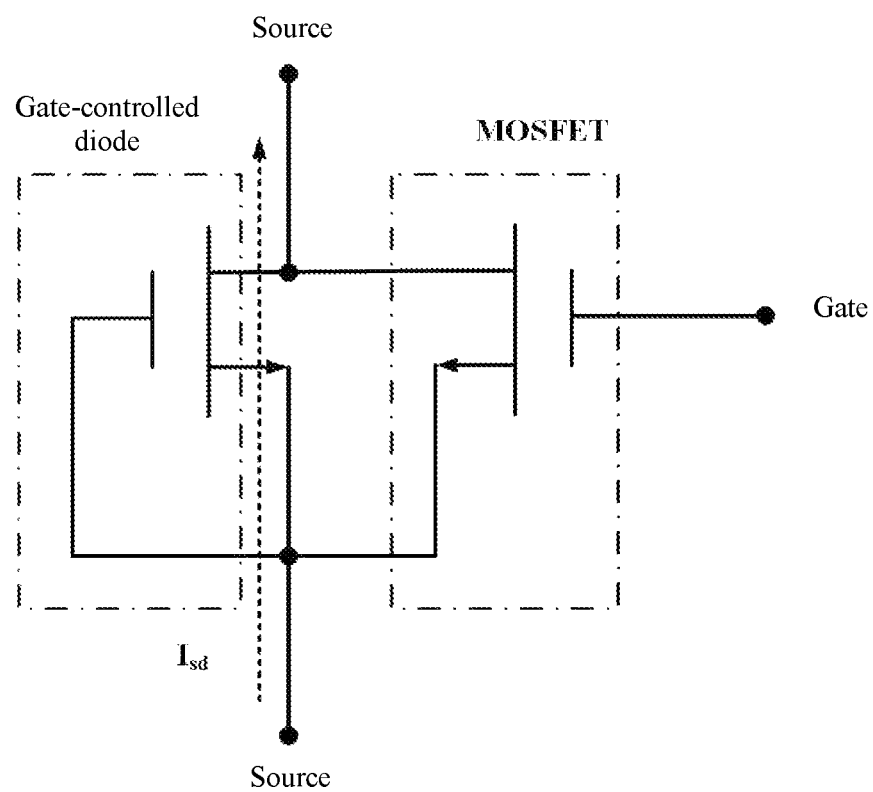
FIG. 11 is an equivalent circuit diagram of the trench SiC MOSFET integrated with a high-speed flyback diode during reverse recovery according to Embodiment of the invention.

According to the trench SiC MOSFET integrated with a high-speed flyback diode provided by the invention, when the device operates normally, a forward bias voltage is applied to a gate in the right MOSFET region to enable the trench, and electrons flow from a source to a drain under the action of an electric field to form a current Ids from drain to the source, as shown in FIG. 10 which is an equivalent circuit diagram of the trench SiC MOSFET integrated with a high-speed flyback diode when the trench SiC MOSFET is forward turned on according to Embodiment 1 of the invention; and when the device is turned off to operate in the third quadrant, a positive potential difference from the source to the drain enables a diode region to be turned on to form a current $I_{sd}$ from the source to the drain, as shown in FIG. 11 which is an equivalent circuit diagram of the trench SiC MOSFET integrated with a high-speed flyback diode when the trench SiC MOSFET is forward turned on according to Embodiment 1 of the invention.

Embodiment 2

Figure 2:
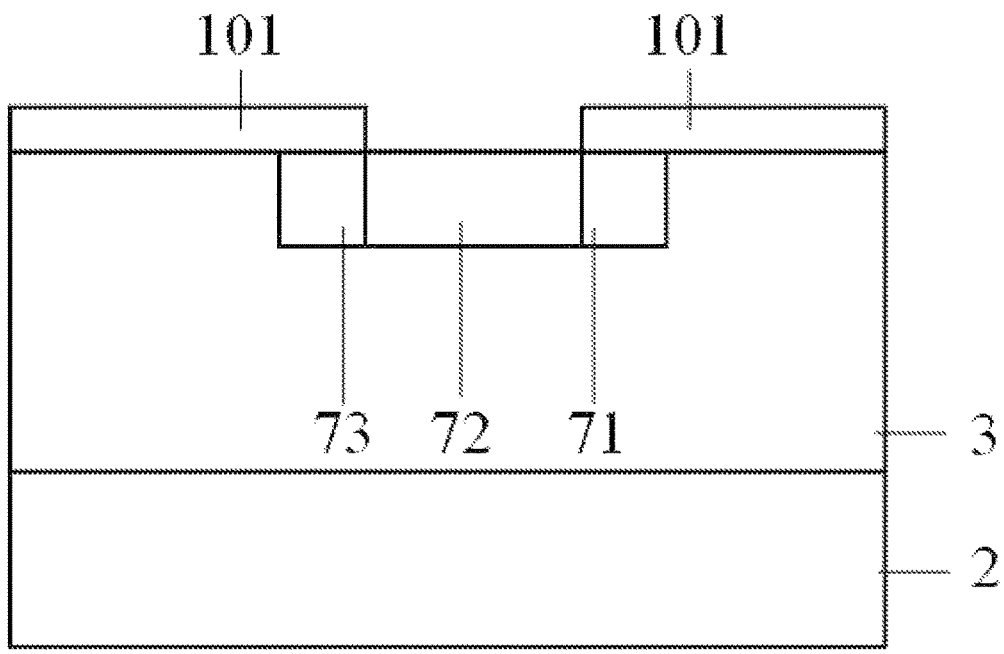
FIG. 2 is a schematic diagram of ion implantation of P-type doped well regions in Step 1 according to Embodiment 2 of the invention.
Figure 3:
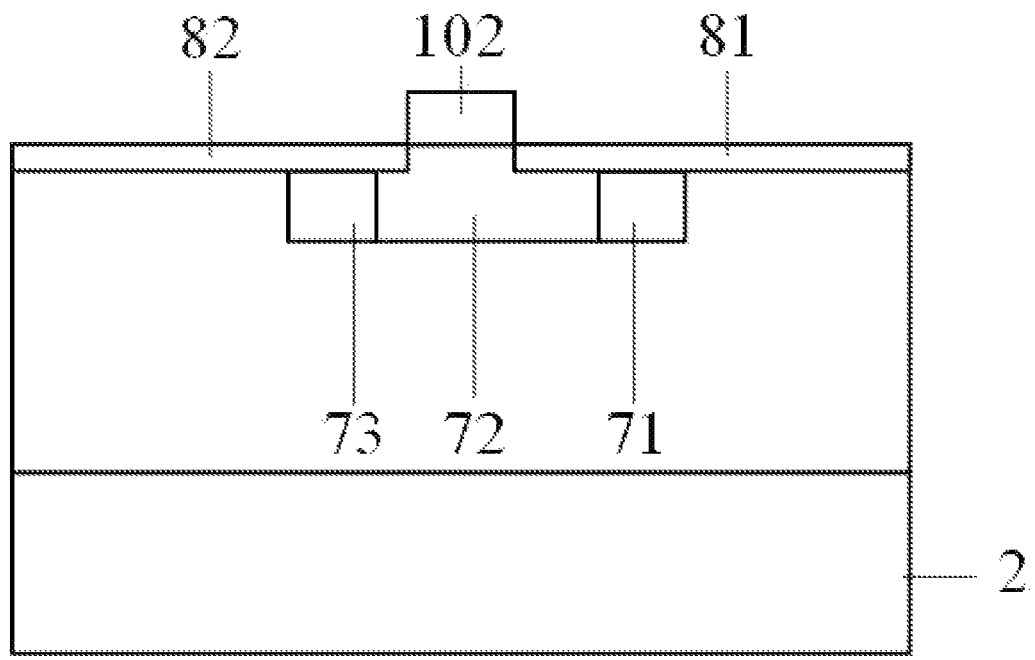
FIG. 3 is a schematic diagram of ion implantation of N-type doped source regions in Step 2 according to Embodiment 2 of the invention.
Figure 4:
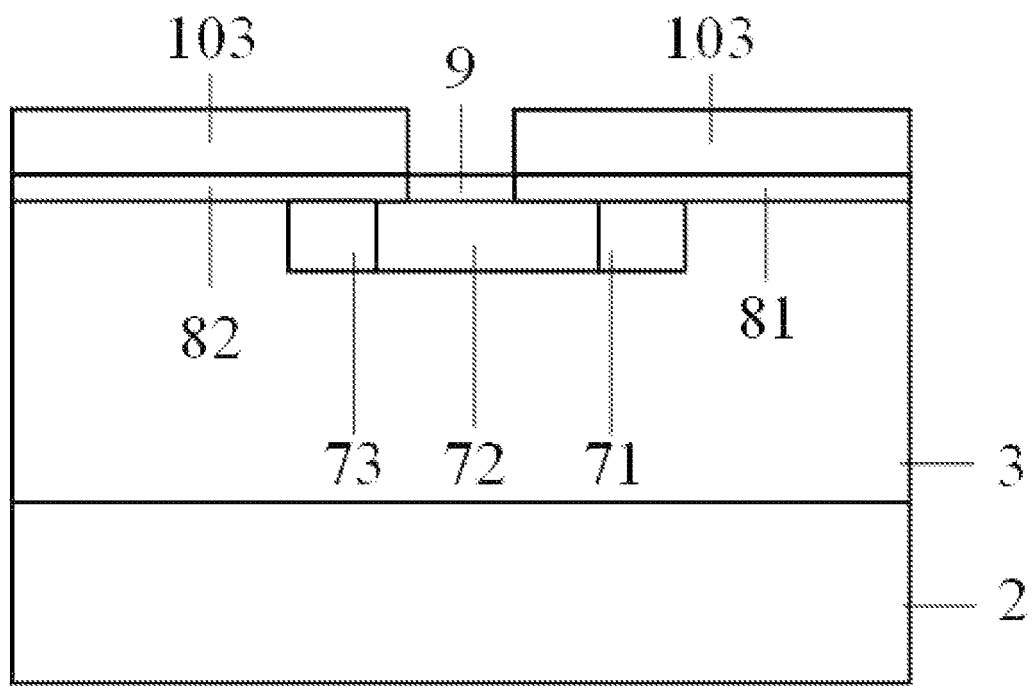
FIG. 4 is a schematic diagram of ion implantation of a P-type doped source region in Step 3 according to Embodiment 2 of the invention.
Figure 5:
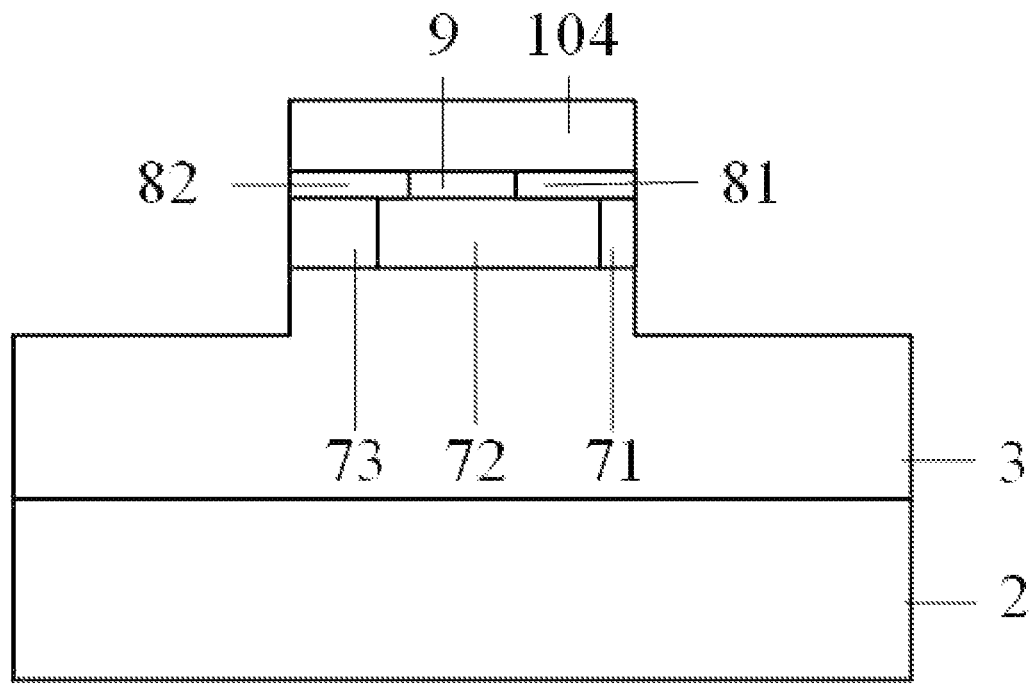
FIG. 5 is a schematic diagram of trench etching in Step 4 according to Embodiment 2 of the invention.
Figure 6:
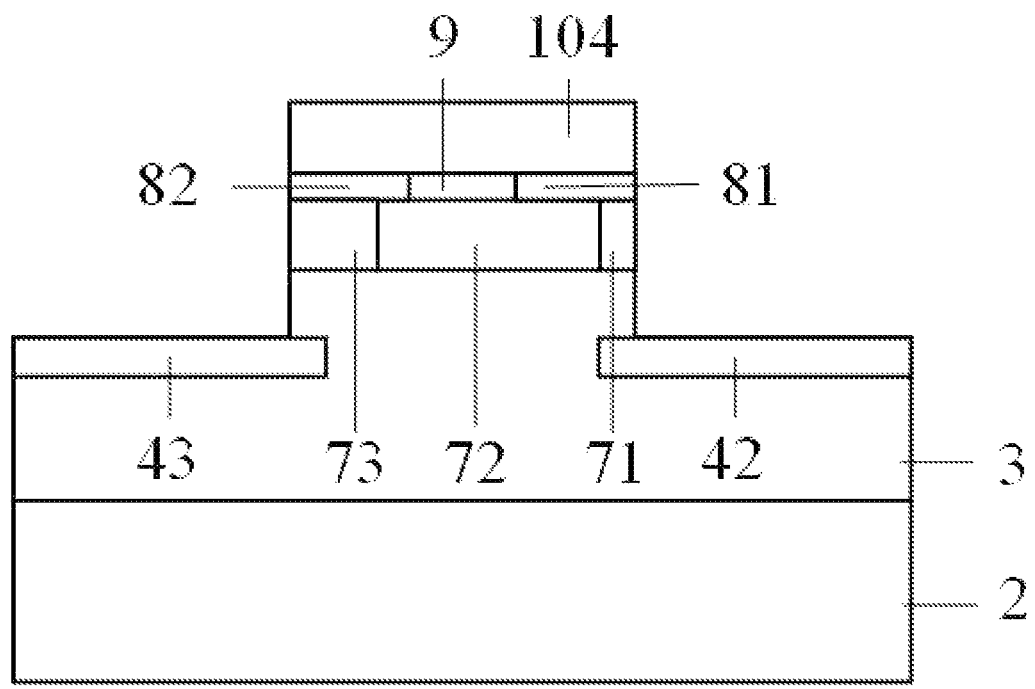
FIG. 6 is a schematic diagram of ion implantation of P-type doped buried layers in Step 5 according to Embodiment 2 of the invention.
Figure 7:
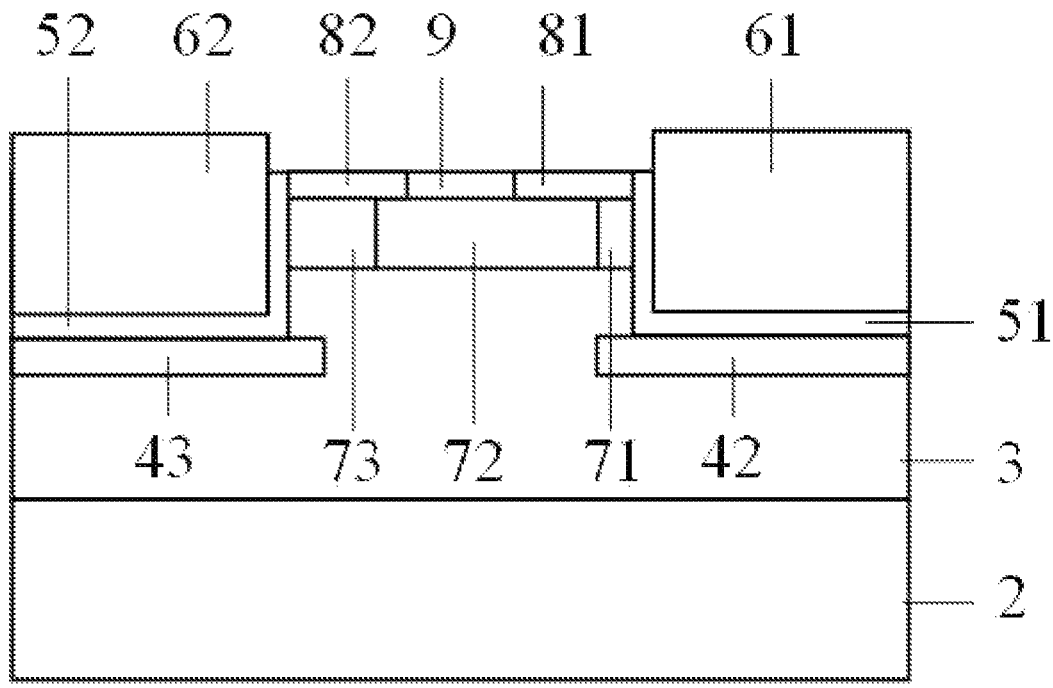
FIG. 7 is a schematic diagram of gate oxide layer formation and polysilicon filling and etching in Step 6 according to Embodiment 2 of the invention.
Figure 8:
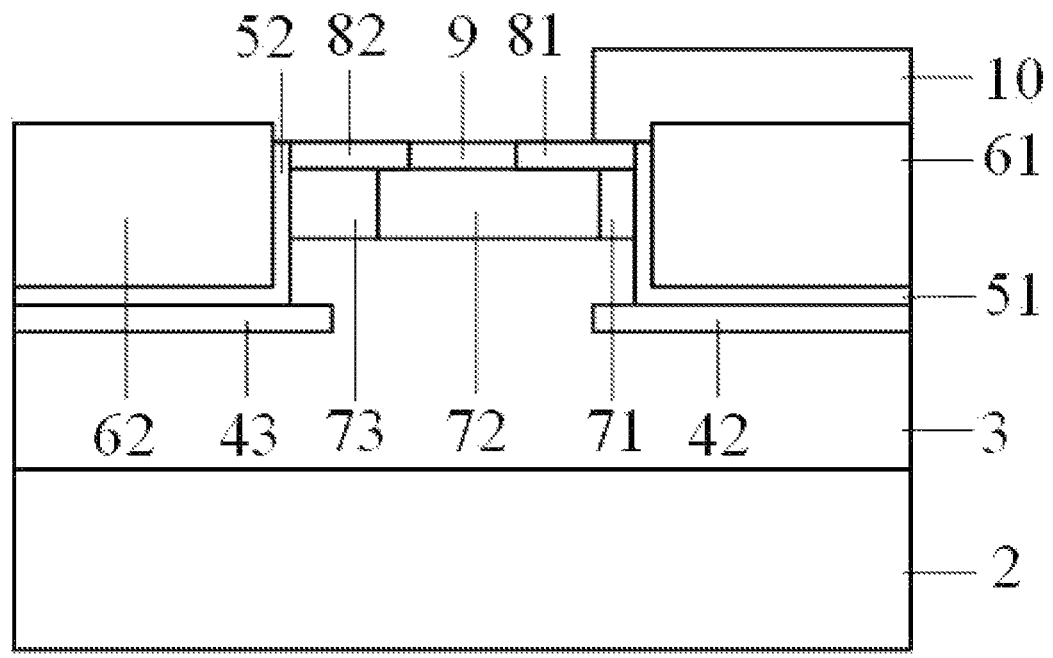
FIG. 8 is a schematic diagram of forming an inter-layer dielectric by lithography in Step 7 according to Embodiment 2 of the invention.
Figure 9:
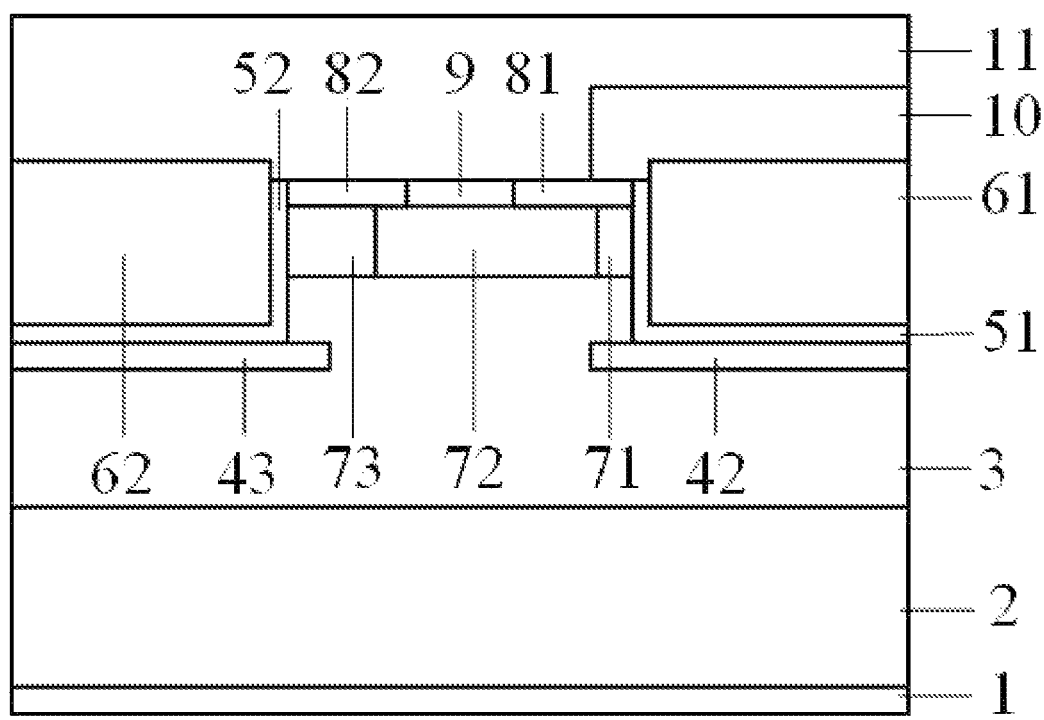
FIG. 9 is a schematic diagram of forming a front ohmic contact alloy and a back metal in Step 8 according to Embodiment 2 of the invention.

As shown in FIG. 2-FIG. 9, this embodiment provides a preparation method of a trench SiC MOSFET integrated with a high-speed flyback diode, comprising the following steps:

Step 1: an oxide layer is deposited on an N-type SiC epitaxial wafer, a P-well ion implantation mask 101 for ion implantation is formed by lithography, then Al ion implantation is performed at a temperature of 300K-1000K to form a second P-type doped well region 72, and P-doped scattering regions with a concentration changing gradually in a traverse direction, which are a first P-type doped well region 71 and a third P-type doped well region 73 respectively, are synchronously formed on left and right sides of the second P-type doped well region 72 by transverse scattering during the Al ion implantation of SiC, such that the structure shown in FIG. 2 is obtained; the mask layer is removed after the Al ion implantation is completed, and surface cleaning is performed;

Step 2: an oxide layer is deposited, an N-type source region ion implantation mask 102 for ion implantation is formed by lithography, and then P ion implantation is performed at a temperature of 300K-1000K to form a first N-type doped source region 81 and a second N-type doped source region 82, such that the structure shown in FIG. 3 is obtained; the mask is removed after the P ion implantation is completed, and surface cleaning is performed;

Step 3: an oxide layer is deposited, a P-type source region ion implantation mask 103 for ion implantation is formed by lithography, and then Al ion implantation is performed at a temperature of 300K-1000K to form a P-type doped source region 9, such that the structure shown in FIG. 4 is obtained; the mask is removed after the Al ion implantation is completed, and surface cleaning is performed;

Step 4: an oxide layer is deposited, a trench etching barrier layer 104 is formed by lithography, and reactive ion etching is performed on an N-type doped SiC epitaxial layer 3 to form a trench, such that the structure shown in FIG. 5 is obtained;

Step 5: Al ion implantation is performed at a high temperature of 300K-1000K to form a second P-type doped buried layer 42 and a third P-type doped buried layer 43 at a bottom of the trench, such that the structure shown in FIG. 6 is obtained; the trench etching barrier layer 104 is removed after the Al ion implantation is completed;

Step 6: a carbon cap is laid, annealing is performed at a high temperature over 1600° C. to activate implanted impurities, a first gate oxide layer 51 and a second gate oxide layer 52 are formed by thermal oxidation, then polysilicon is deposited, and a first polysilicon layer 61 and a second polysilicon layer 62 are formed by etching, such that the structure shown in FIG. 7 is obtained;

Step 7: an oxide layer is deposited, and an inter-layer dielectric 10 is obtained by lithography, such that the structure shown in FIG. 8 is obtained; and Step 8: an Ni alloy is deposited, a metal silicide is formed by annealing, then Al is deposited on a front side of the device to form a source metal, the Ni alloy is sputtered on a back side of the device, and a back ohmic contact alloy 1 is formed by annealing, such that the structure shown in FIG. 9 is obtained.

What is claimed is:

1. A trench SiC MOSFET integrated with a high-speed flyback diode, comprising a back ohmic contact alloy, an N-type doped SiC substrate, an N-type doped SiC epitaxial layer, a first P-type doped buried layer, a second P-type doped buried layer, a third P-type doped buried layer, a first gate oxide layer, a second gate oxide layer, a first polysilicon layer, a second polysilicon layer, a first P-type doped well region, a second P-type doped well region, a third P-type doped well region, a first N-type doped source region, a second N-type doped source region, a P-type doped source region, an inter-layer dielectric, and a front ohmic contact alloy;

in a plane defined by an x-axis and a y-axis, the N-type doped SiC substrate is located over the back ohmic contact alloy, the N-type doped SiC epitaxial layer is located over the N-type doped SiC substrate, the second P-type doped buried layer is located over a right portion of the N-type doped SiC epitaxial layer, the third P-type doped buried layer is located over a left portion of the N-type doped SiC epitaxial layer, the first gate oxide layer is located over the second P-type doped buried layer, the second gate oxide layer is located over the third P-type doped buried layer, the first polysilicon layer is located over a right portion of the first gate oxide layer, the second polysilicon layer is located over a left portion of the second gate oxide layer, the first N-type doped source region is located over a left portion of the first gate oxide layer, the P-type doped source region is located on a left side of the first N-type doped source region, the second N-type doped source region is located on a left side of the P-type doped source region and is connected to a right side of the second gate oxide layer, the first P-type doped well region is located under the first N-type doped source region and on a left side of the first gate oxide layer, the second P-type doped well region is located under the first N-type doped source region, the P-type doped source region and the second N-type doped source region and on a left side of the first N-type doped source region, the third P-type doped well region is located under the second N-type doped source region and on a left side of the second P-type doped well region, the inter-layer dielectric is located over the first N-type doped source region, the first gate oxide layer and the first polysilicon layer, and the front ohmic contact alloy is located over the inter-layer dielectric, the first N-type doped source region, the P-type doped source region, the second N-type doped source region, the second gate oxide layer, and the second polysilicon layer;

in a plane defined by the y-axis and a z-axis, the N-type doped SiC substrate is located over the back ohmic contact alloy, the N-type doped SiC epitaxial layer is located over the N-type doped SiC substrate, the first P-type doped buried layer is located at an upper right position in the N-type doped SiC epitaxial layer, the second P-type doped buried layer is located at an upper left position in the N-type doped SiC epitaxial layer, the first gate oxide layer is located over the first P-type doped buried layer, the N-type doped SiC epitaxial layer and the second P-type doped buried layer, the first polysilicon layer is located over the first gate oxide layer, the inter-layer dielectric is located over the first polysilicon layer, and the front ohmic contact alloy is located over the inter-layer dielectric.

2. The trench SiC MOSFET integrated with the high-speed flyback diode according to claim 1, wherein the N-type doped SiC epitaxial layer has a doping concentration of $1E15$ cm$^{-3}$-$1E17$ cm$^{-3}$.

3. The trench SiC MOSFET integrated with the high-speed flyback diode according to claim 1, wherein the first P-type doped well region is formed by transverse scattering during Al ion implantation, and has a concentration decreasing gradually in a negative direction of the x-axis, and a concentration of the first P-type doped well region close to the first gate oxide layer is $1E14$ cm$^{-3}$-$1E16$ cm$^{-3}$.

4. The trench SiC MOSFET integrated with the high-speed flyback diode according to claim 1, wherein the third P-type doped well region is formed by traverse scattering during Al ion implantation, and has a concentration decreasing gradually in a positive direction of the x-axis, and a concentration of the third P-type doped well region close to the second gate oxide layer is $0$-$1E15$ cm$^{-3}$.

5. A preparation method of the trench SiC MOSFET integrated with the high-speed flyback diode according to any one of claim 1, comprising:

step 1: depositing an oxide layer on an N-type SiC epitaxial wafer, forming a P-well ion implantation mask for ion implantation by lithography, then performing Al ion implantation at a temperature of 300K-1000K to form the second P-type doped well region, synchronously forming P-doped scattering regions with a concentration changing gradually in a traverse direction, which are the first P-type doped well region and the third P-type doped well region respectively, on left and right sides of the second P-type doped well region by transverse scattering during the Al ion implantation of SiC, removing a mask layer after the Al ion implantation is completed, and performing surface cleaning;

step 2: depositing an oxide layer, forming an N-type source region ion implantation mask for ion implantation by lithography, then performing P ion implantation at a temperature of 300K-1000K to form the first N-type doped source region and the second N-type doped source region, removing a mask after the P ion implantation is completed, and performing surface cleaning;

step 3: depositing an oxide layer, forming a P-type source region ion implantation mask for ion implantation by lithography, then then performing Al ion implantation at a temperature of 300K-1000K to form the P-type doped source region, removing a mask after the Al ion implantation is completed, and performing surface cleaning;

step 4: depositing an oxide layer, forming a trench etching barrier layer by lithography, and then performing reactive ion etching on the N-type doped SiC epitaxial layer to form a trench;

step 5: performing Al ion implantation at a high temperature of 300K-1000K to form the second P-type doped buried layer and the third P-type doped buried layer at a bottom of the trench, and removing the trench etching barrier layer after the Al ion implantation is completed;

step 6: laying a carbon cap, performing annealing at a high temperature over 1600° C. to activate implanted impurities, forming the first gate oxide layer and the second gate oxide layer by thermal oxidization, then depositing polysilicon, and forming the first polysilicon layer and the second polysilicon layer by etching;

step 7: depositing an oxide layer, and forming the inter-layer dielectric by lithography; and step 8: depositing an Ni alloy, forming a metal silicide by annealing, then depositing Al on a front side of a device to form a source metal, sputtering the Ni alloy on a back side of the device, and forming the back ohmic contact alloy by annealing.

6. The preparation method according to claim 5, wherein in the trench SiC MOSFET integrated with the high-speed flyback diode, the N-type doped SiC epitaxial layer has a doping concentration of $1E15$ cm$^{-3}$-$1E17$ cm$^{-3}$.

7. The preparation method according to claim 5, wherein in the trench SiC MOSFET integrated with the high-speed flyback diode, the first P-type doped well region is formed by transverse scattering during Al ion implantation, and has a concentration decreasing gradually in a negative direction of the x-axis, and a concentration of the first P-type doped well region close to the first gate oxide layer is $1E14$ cm$^{-3}$-$1E16$ cm$^{-3}$.

8. The preparation method according to claim 5, wherein in the trench SiC MOSFET integrated with the high-speed flyback diode, the third P-type doped well region is formed by traverse scattering during Al ion implantation, and has a concentration decreasing gradually in a positive direction of the x-axis, and a concentration of the third P-type doped well region close to the second gate oxide layer is $0$-$1E15$ cm$^{-3}$.

* * * * *